United States Patent
Akutsu et al.

(10) Patent No.: US 8,309,224 B2
(45) Date of Patent: Nov. 13, 2012

(54) CONDUCTIVE PARTICLE, ANISOTROPIC CONDUCTIVE INTERCONNECTION MATERIAL THAT USES THE CONDUCTIVE PARTICLE, AND METHOD FOR PRODUCING THE CONDUCTIVE PARTICLE

(75) Inventors: Yasushi Akutsu, Tochigi (JP); Hidetsugu Namiki, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 286 days.

(21) Appl. No.: 12/515,118

(22) PCT Filed: Apr. 11, 2008

(86) PCT No.: PCT/JP2008/057150
§ 371 (c)(1),
(2), (4) Date: May 15, 2009

(87) PCT Pub. No.: WO2008/133037
PCT Pub. Date: Nov. 6, 2008

(65) Prior Publication Data
US 2010/0051878 A1 Mar. 4, 2010

(30) Foreign Application Priority Data
Apr. 16, 2007 (JP) .................. 2007-107475

(51) Int. Cl.
*B32B 5/16* (2006.01)
(52) U.S. Cl. ........ 428/407; 252/500; 428/402; 428/403; 427/180

(58) Field of Classification Search .................. 252/500; 427/180; 428/402, 403, 407
See application file for complete search history.

(56) References Cited

U.S. PATENT DOCUMENTS
2007/0054984 A1 * 3/2007 Jun et al. .............. 523/204

FOREIGN PATENT DOCUMENTS
| EP | 1 426 979 A1 | 6/2004 |
| JP | 2005-44773 A | 2/2005 |
| WO | 03/025955 A1 | 3/2003 |
| WO | 2005/004172 A1 | 1/2005 |

OTHER PUBLICATIONS
International Search Report w/translation from PCT/JP2008/057150 datd Jul. 8, 2008 (7 pages).
Notification of Transmittal of Copies of Translation of the International Preliminary Report on Patentability (Chapter I or Chapter II of the Patent Cooperation Treaty) for International Application No. PCT/JP2008/057150, mailed on Nov. 19, 2009 (8 pages).

* cited by examiner

*Primary Examiner* — Mark Kopec
*Assistant Examiner* — Haidung Nguyen
(74) *Attorney, Agent, or Firm* — Osha Liang LLP

(57) ABSTRACT

There is disclosed a conductive particle used for an anisotropic conductive connection material for establishing conductive interconnection between e.g. a substrate and an electrical component. The conductive particle includes a base particle (2) exhibiting electrical conductivity at least on its surface and a continuous insulating resin film (3) formed by welding of fine particles (3a) of an insulating resin that composes the resin film. The surface of the base particle is coated with the continuous insulating resin film. There are formed voids at least between neighboring fine particles.

7 Claims, 4 Drawing Sheets

US 8,309,224 B2

CONDUCTIVE PARTICLE, ANISOTROPIC CONDUCTIVE INTERCONNECTION MATERIAL THAT USES THE CONDUCTIVE PARTICLE, AND METHOD FOR PRODUCING THE CONDUCTIVE PARTICLE

TECHNICAL FIELD

This invention relates to a conductive particle used in an anisotropic conductive interconnection material that electrically interconnects a substrate and electronic parts, and the anisotropic conductive interconnection material that uses the conductive particle. This invention also relates to a method for producing the conductive particle.

The present application claims priority rights based on the Japanese Patent Application 2007-107475, filed in Japan on Apr. 16, 2007. The total disclosure of this patent application of the senior filing date is to be incorporated herein by reference.

BACKGROUND ART

In related art, to interconnect a connection terminal of a semiconductor device and a connection terminal of a substrate, on which to mount the semiconductor device, the practice has been to interconnect the two connection terminals by anisotropic conductive interconnection with the use of an anisotropic conductive interconnection material. With such anisotropic conductive interconnection, a film-like or paste-like anisotropic conductive connection material, obtained on dispersing fine conductive particles in an insulating adhesive, is sandwiched between the two materials to be connected. The resulting assembly is heated and pressured to bond the two materials and the connection material together as electrical conductivity is maintained.

Recently, with the tendency towards miniaturization and higher performance of semiconductor devices, as exemplified by a liquid crystal display device, miniaturization of circuits as to be used the anisotropic conductive interconnection is progressing. To cope with this, a strong demand is presented for fine pitch between the circuits, while there is felt a strong concern as to the tendency to shorting which may be produced on setting up the anisotropic conductive interconnection. To meet this general demand for the fine pitch, a conductive particle 101 made up of a conductive particle 102, used as an anisotropic conductive interconnection material, and an insulating resin film 103, coated on the particle 102, as shown in FIG. 1, has come to be used to show two functions that are contrary to each other, namely the electrical conductivity and the insulating properties.

However, as the pitch becomes finer, there is presented a problem that, with a conventional insulating film uniformly coated on a conductive particle, if the film thickness is increased to assure the insulating properties between neighboring circuit components, the electrical conductivity is lowered due to the aforementioned characteristics acting in contrary fashion to each other, namely the insulating properties and the electrical conductivity.

DISCLOSURE OF THE INVENTION

Problems to be Solved by the Invention

The present invention provides a conductive particle useful for improving interconnection reliability even with narrow-pitch bumps, a conductive particle, an anisotropic conductive interconnection material employing the conductive particle, and a method for producing the conductive particle.

A conductive particle according to an embodiment of the present invention includes a base particle exhibiting electrical conductivity at least on its surface, and a continuous insulating resin film that covers the surface of the base particle. The resin film is formed by welding of fine particles of the insulating resin. There are formed voids at least between neighboring fine particles.

An anisotropic conductive connection material of an embodiment of the present invention includes larger numbers of the conductive particles dispersed in an insulating adhesive.

A method for producing a conductive particle according to an embodiment of the present invention includes coating a surface of a base particle with an insulating resin film by colliding fine particles of the insulating resin to the surface of the base particle to cause adhesion of the fine particles to the surface of the base particle. At least the surface of the base particle exhibits the electrical conductivity. The insulating resin of the fine particle is selected from the group consisting of a cross-linked acrylic resin, a styrene-acryl copolymer, a divinylbenzene-acryl copolymer, a styrene-divinylbenzene copolymer, a melamine-formaldehyde copolymer, a silicone-acryl copolymer, a polyamide, a polyimide, polybutadiene and NBR.

A method for producing a conductive particle according to another embodiment of the present invention includes a first step of forming an insulating resin film presenting larger numbers of voids in an initial state by collision fine particles of an insulating resin to a surface of a base particle. At least the surface of the base particle exhibits the electrical conductivity. The method of the present invention also includes a second step of continuing the collision of the fine particles to such an extent that the voids on a surface of the insulating resin film are decreased and the voids towards the base particle are maintained.

The conductive particle according to another embodiment of the present invention includes a continuous insulating resin film that coats the base particle exhibiting the electrical conductivity. The insulating resin film is formed by welding of the fine particles of the insulating resin. There are formed preset voids between neighboring fine particles to assure the insulating properties between bumps. The insulating resin film on the outer shell may readily be cracked to assure facilitated reliable interconnection performance and high connection reliability even with narrow-pitch bumps.

With the anisotropic conductive interconnection material according to another embodiment of the present invention, high connection reliability is realized because the conductive particles that assure facilitated reliable interconnection performance even with narrow-pitch bumps are dispersed in an insulating adhesive.

With the method for producing the conductive particle, according to another embodiment of the present invention, it is possible to prepare a conductive particle having preset voids within the bulk of an insulating resin film that coats a base particle, such as to assure facilitated reliable interconnection performance and high interconnection reliability even with narrow-pitch bumps.

Other objects and advantages of the present invention will become apparent from the following description of its preferred embodiments which will now be made with reference to the drawings.

BRIEF DESCRIPTION OF THE DRAWINGS

FIG. 3A shows a conductive particle with an insulating film in a state in which the processing for hybridization has been continued beyond a state of production by the method of the present invention for the sake of comparison with the present invention. FIG. 3B shows a conductive particle with an insulating film in a state in which the particle has been produced by the method of the present invention, that is, a state in which the second step of the method of the present invention has been finished. FIG. 3C shows a conductive particle with an insulating film in a state in which the first step of the inventive method has been finished.

BEST MODE FOR CARRYING OUT THE INVENTION

A conductive particle carrying thereon an insulating film, according to the present application, and an anisotropic conductive interconnection material that uses the conductive particle, carrying thereon an insulating film, will now be described with reference to the drawings.

According to an embodiment of the present application, a conductive particle 1 carrying an insulating film thereon, is used in an anisotropic conductive interconnection material, such as an anisotropic conductive adhesive. According to an embodiment of the present application, the anisotropic conductive adhesive as an anisotropic conductive interconnection material includes also an insulating adhesive as a binder resin, into which are dispersed larger numbers of the conductive particles 1 each carrying the insulating film thereon. As the insulating adhesive, thermosetting resins, such as epoxy or phenoxy resins, are preferably used. The present invention may also be applied to an anisotropic conductive film (ACF) included by this anisotropic conductive adhesive on a release film.

Figure 1:
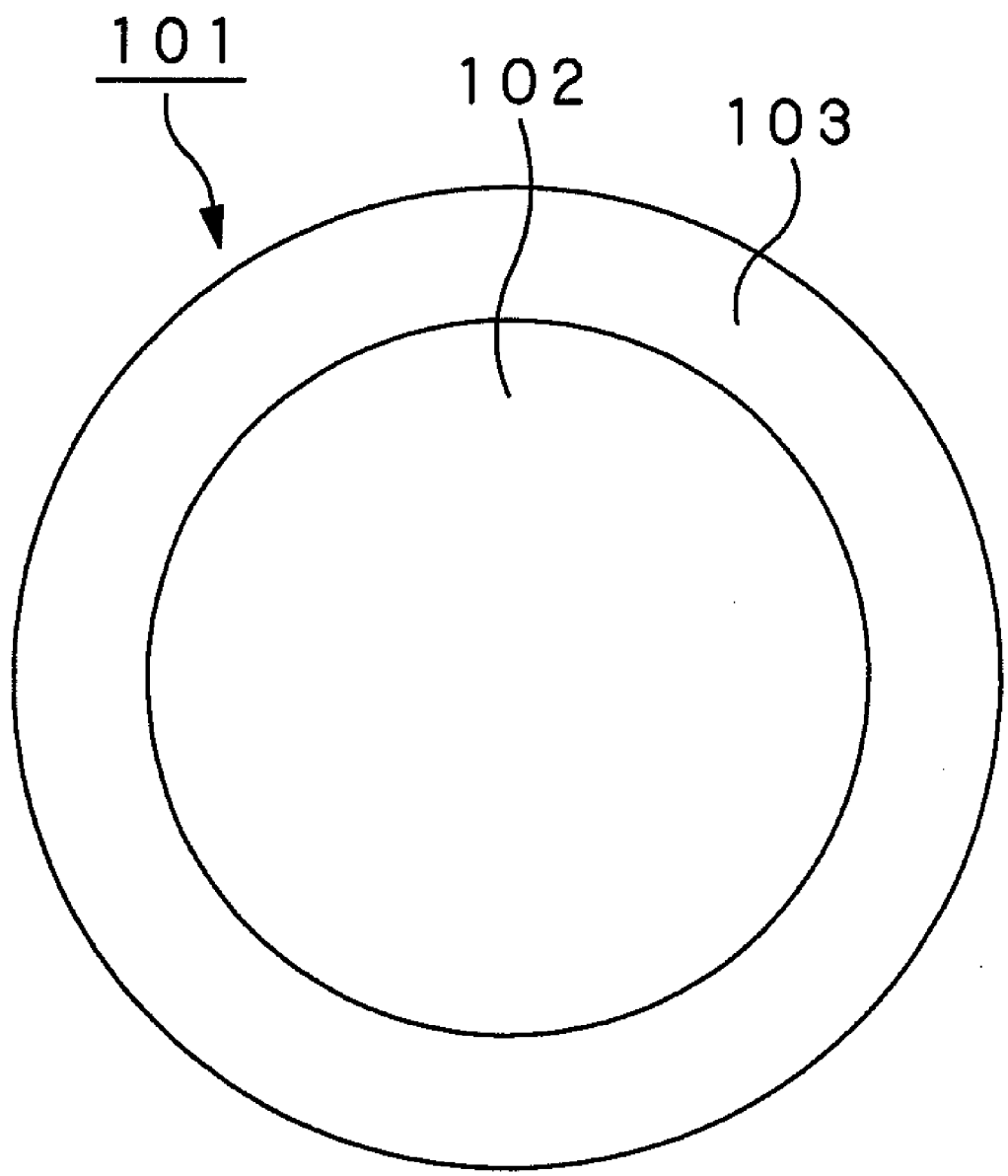
FIG. 1 is a cross-sectional view showing a conductive particle in related art.
Figure 2:
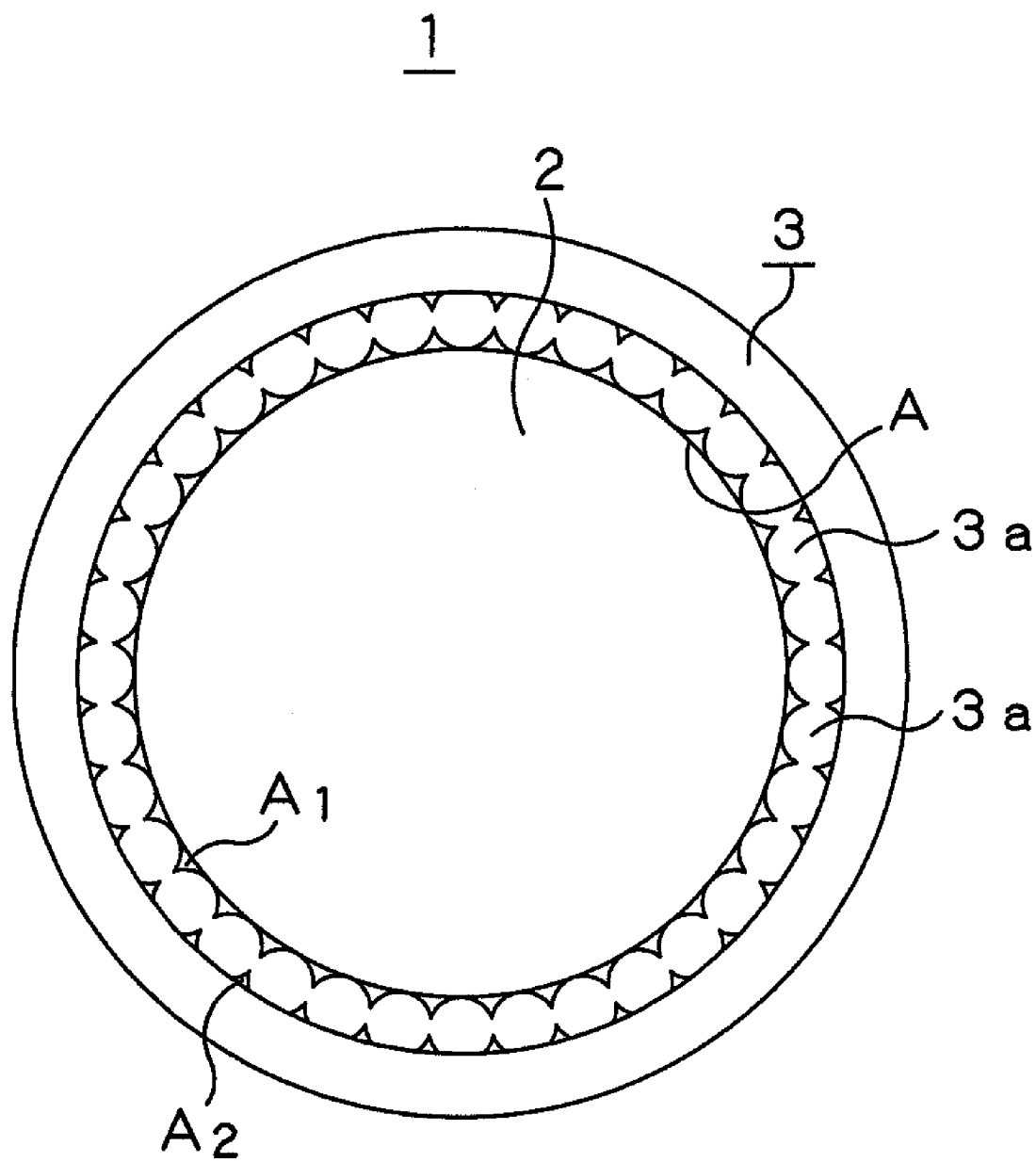
FIG. 2 is a cross-sectional view showing a conductive particle according to an embodiment of the present invention.

Referring to FIG. 2, this conductive particle 1 carrying thereon an insulating film, is made up of a conductive particle 2 used as a base particle, and an insulating resin film 3 is formed as a continuous film by welding of fine particles 3a of the insulating resin together, whereby the fine particles cover surface of the conductive particle. The insulating resin film 3 is sometimes referred to below as an outer shell insulating layer. The continuous insulating resin film 3, formed by welding the fine particles 3a of the insulating resin, has larger numbers of voids A between neighboring ones of the fine particles 3a to demonstrate both the insulating characteristic and the conductive characteristic of the conductive particle 1 carrying thereon the insulating film. Each void A is a fraction of an interstice delimited between a cube circumscribed to a sphere and the sphere. This fraction is a space left after 20 to 60% of the interstice were buried with the fine particles as a result of welding. The void ratio of the interstice between the cube and the sphere is approximately 47.64% ($=100\times(1-\frac{4}{3}\times \pi\times(\frac{1}{2})^3)$), while the void ratio that is in a state that approximately 20 to 60% of the interstice were buried with the fine particles is 19.1 to 38.1%. It is noted that the void ratio shows the percentage of the cubic content of the void A based on 100% of the total cubic content including the void A in the insulating resin film 3.

The conductive particle 1 carrying thereon an insulating film, is formed by causing the fine particles 3a of the insulating resin to collide the surface of the conductive particle 2 to deposit the fine particles on the surface of the conductive particle 2 in a manner as later described. By so doing, the surface of the conductive particle 2 is coated by the insulating resin film 3. When the conductive particle 2 is coated by the insulating resin film 3 in this manner, the fine particles are deposited on the surface of the base particle so that a space is provided between the neighboring fine particles such as to maintain the void ratio of the insulating resin film 3 in a range of 19.1 to 38.1%. The insulating resin film 3 is formed in such a manner that there is substantially no void on its outer surface, which is thus smooth, while larger numbers of voids A are caused to exist on an inner surface of the insulating resin film 3, that is, the surface of the insulating resin film directing to the base particle 2. In addition, the insulating resin film 3 is formed so that the amount of the voids A will decrease from the surface of the base particle 2 along the film thickness, that is, so that the amount of the voids A2 on the outer side is smaller than that of voids A1 on the inner side. That is, the insulating resin film 3 is sparse towards its inner side part, while being dense towards its outer side part including its outer surface that forms its outer shell.

The conductive particle 2 has electrical conductivity at least in its outer surface, and represents a base particle of the conductive particle 1 carrying thereon an insulating film. The conductive particle 2 may, for example, be a particle of metal, such as gold, silver, platinum, nickel, copper, or a tin/nickel alloy, or a particle of resin, such as styrene, divinylbenzene or benzoguanamine, as a nucleus, the surface of which is plated with nickel or nickel/gold.

The conductive particle 2 is of a particle size of the order of 3 to 10 μm, for example, is used. The fine particle 3a of the insulating resin is of a particle size on the order of one-tenth of that of the conductive particle 2, and specifically on the order of 100 to 400 nm. The insulating resin film 3 formed by welding, has a thickness on the order of, for example, 200 to 300 nm. The insulating resin film 3 presents a substantially uniform outer surface, as a result of the welding, with an inner surface of the insulating resin film 3 presenting the voids between the neighboring fine particles, as described above.

The fine particles 3a of the insulating resin that form the insulating resin film 3 are solid particles. The fine particles 3a of the insulating resin are caused to collide the surface of the conductive particle 2 as the base particle so as to be deposited thereon, as previously mentioned. In addition, the voids A need to be formed in the interior of the insulating resin film 3 such as to demonstrate conductive characteristic and insulating characteristic. To this end, solid particles are preferred to hollow particles. To prepare the fine particles 3a of the insulating resin, cross-linked acrylic resin, a styrene-acryl copolymer, a divinylbenzene-acryl copolymer, a styrene-divinylbenzene copolymer, a melamine-formaldehyde copolymer, a silicone-acryl copolymer, a polyamide, a polyimide, polybutadiene and NBR, for example, are used.

The properties of the particles used as the fine particles 3a of the insulating resin that form the insulating resin film 3, are selected in such a manner that, when the particles are pressed by a heat press for ten minutes under a condition of 100° C. and 2 MPa, the particles are fused together, and that, when the particles are pressed by the same heat press for ten minutes under a condition of 70° C. and 2 MPa, the particles are not formed into a film, that is, are not fused together but are kept in the state of fine particles. The heat press used is such a one that operates for pressuring a work under heating. The reason the above conditions are used is that the fine particles that are not fused together under the condition of 100° C. and 2 MPa tend to be detached from the conductive particle 2, and that, if the fine particles that are fused together under the condition of 70° C. and 2 MPa are used as the fine particles of the insulating resin film, it may become difficult to form the voids A in the manner defined above. Meanwhile, the frictional heat between the fine particles 3*a* of the insulating resin and that between the fine particles 3*a* and the conductive particle 2 at the time of collision between the fine particles 3*a* and the conductive particle 2 in the course of the processing of hybridization as later described is on the order of 80° C. under the conditions which will be set forth later.

The conductive particle 1 carrying thereon an insulating film has the continuous insulating resin film 3 as the outer shell. This continuous insulating resin film is formed by welding of fine particles 3*a* of the insulating resin. The outer shell covers the conductive particle 2 which is the base particle 2 at least a surface of which is conductive. The insulating properties between the bumps is assured by the voids A between the neighboring fine particles 3*a*. In addition, the insulating resin film 3 of the outer shell is rendered breakable to assure the high interconnection performance even with narrow-pitch bumps when the conductive particle 1 carrying thereon an insulating film is used in the anisotropic conductive interconnection material. That is, the conductive particle 1 carrying thereon an insulating film demonstrates superior electrical conductivity and insulating performance to achieve high interconnection reliability.

With the conductive particle 1 carrying thereon an insulating film, the fine particles 3*a* of the insulating resin used for forming the insulating resin film 3 are formed of a material selected from the group consisting of a cross-linked acrylic resin, a styrene-acryl copolymer, a divinylbenzene-acryl copolymer, a styrene-divinylbenzene copolymer, a melamine-formaldehyde copolymer, a silicone-acryl copolymer, a polyamide, a polyimide, polybutadiene and NBR. It is thus possible to provide the void A of the void ratio on the order of 19.1 to 38.1% between the neighboring fine particles of the insulating resin film 3. By coating the conductive particles 2 as the base particles with the insulating resin film 3 presenting the preset voids A as described above, superior electrical conductivity and insulating performance may be demonstrated even with narrow-pitch bumps to assure the facilitated highly reliable interconnection performance.

Further, with the anisotropic conductive interconnection material, provided with the conductive particle 1 carrying thereon the insulating film, the conductive particle 1 carrying the insulating film thereon is dispersed within the insulating adhesive, as described above. It is thus possible to maintain a facilitated interconnection performance and high connection reliability even with narrow-pitch bumps.

The conductive particle 1 carrying thereon the insulating film according to the embodiment of the present invention is prepared by welding of the fine particles 3*a* of the insulating resin film on the surface of the conductive particle 2 to form the insulating resin layer thereon by processing by a known hybridization system, sometimes referred to below as 'hybridization processing'. This hybridization processing compounds a fine particle with another fine particle (see 'Powder and Industry', vol. 27, No. 8, 1995, p 35-42). With this processing, the mechanical-thermal energy, consisting mainly of the force of impact, is imparted to a parent particle and a child particle dispersed in a gaseous phase, thereby fixing the particles to form a film composed of the so fixed particles. Specified conditions for this hybridization processing may suitably be determined in dependence upon the feedstock material or an apparatus used.

The film thickness of the insulating resin film 3, formed to coat the conductive particle 2, and the voids between the fine particles formed within the insulating resin film 3, for producing the conductive particle 1 carrying thereon the insulating film by the hybridization processing, have so far been described.

That is, the method for producing the conductive particle carrying thereon the insulating film according to the embodiment of the present invention includes a first step of forming the insulating resin film 3*c* that includes voids Ac in an initial state by colliding fine particles 3*a* of the insulating resin to a surface of conductive particle 2 as a base particle. The method also includes a second step of continuing the collision of the fine particles 3*a* to such an extent that the voids Ac on a surface of the insulating resin film 3*c* are decreased and the voids Ac towards the base particle are maintained. At least the surface of the conductive particle as the base particle exhibits the electrical conductivity.

Figure 3A:
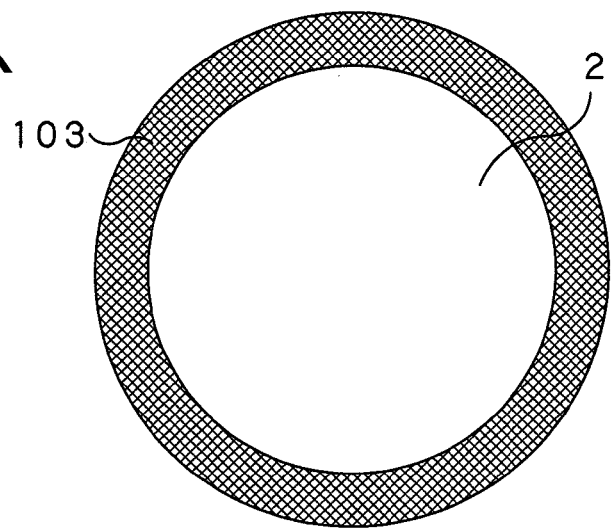
FIGS. 3A to 3C are cross-sectional views for illustrating various steps of a method for producing the conductive particle according to an embodiment of the present invention.
Figure 3B:
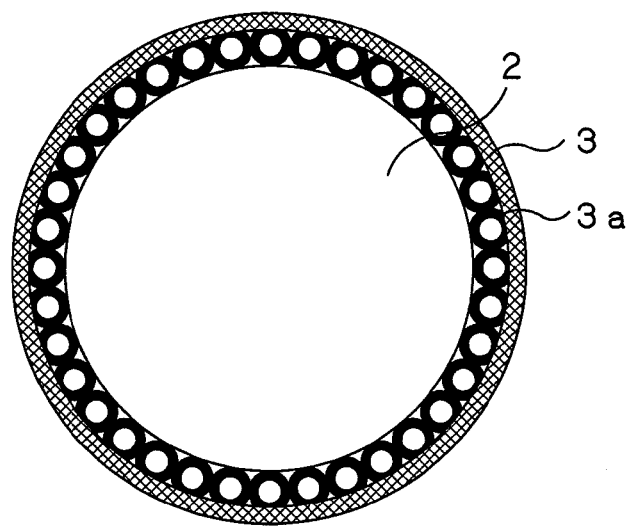
Figure 3C:
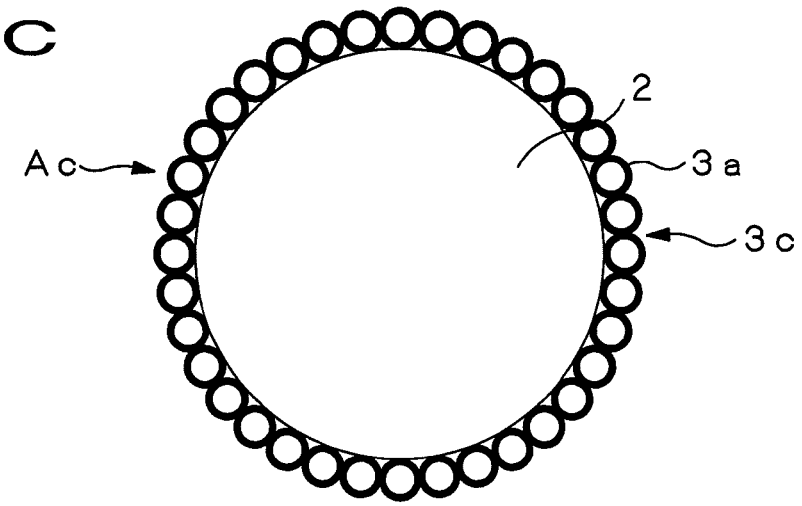

In the first step of this method, the above-described hybridization processing is carried out for a preset time to form an initial-state insulating resin film 3*c* that presents voids Ac on the surface of the insulating resin film itself as well by the fine particles 3*a* of the insulating resin to collide with the surface of the conductive particle 2, as shown in FIG. 3C.

In the second step, the hybridization processing is continued further for a preset time to cause the fine particles 3*a* of the insulating resin to collide with the initial-state insulating resin film 3*c* constituting an outer shell of the base particle. This builds an insulating resin film 3 shown in FIG. 3B in which the voids are decreased to such an extent that there are no voids on the surface of the insulating resin film to render the surface uniform, and in which there are included voids A between neighboring fine particles within the bulk of the insulating resin film. By controlling the conditions of the hybridization at this time, it is possible to form the continuous insulating resin film 3 in which there are included voids within the bulk of the insulating resin film between neighboring fine particles at a preset void ratio. However, the film also presents a continuous surface based on welding of the fine particles. Specifically, by controlling the conditions of the hybridization for the first and second steps, such as rpm or time durations, it is possible to form such insulating resin film 3 in which larger numbers of voids A1 are included in an inner part, with the number of voids A2 towards an outer part decreasing to present a uniform smooth film state on the film surface. The insulating resin film has the voids at a preset void ratio.

If the hybridization processing is continued further for preset time from the state of FIG. 3B, a insulating resin film 103 shown in FIG. 3A is formed. This film includes no voids and is uniform from the outer surface down to the innermost peripheral surface. Stated another way, the process of producing the conductive particle 1 carrying thereon an insulating film according to the embodiment of the present invention is controlled in its production process to come to a close at a state in which the film includes the preset voids, that is, at a state short of that of forming the insulating resin film 103 which is uniform throughout the film thickness. That is, such fine particles 3*a* of the insulating resin film 3, capable of forming the preset voids by the hybridization processing, are selected and used. On the other hand, the condition of the hybridization is controlled so that preset voids will be produced between the fine particles 3*a* that also form the continuous insulating resin film 3 to present a continuous smooth surface on welding. By so doing, it is possible to form the insulating resin film 3 that has a uniform surface state and that also presents voids at the preset void ratio in such a manner that the insulating properties and the electrical conductivity of the conductive particle 1 carrying thereon an insulating film will be demonstrated together.

The conductive particle 1 carrying thereon the insulating film, produced as described above, is then dispersed in an insulating adhesive to enable a paste-like or film-like anisotropic conductive interconnection material to be produced. The insulating adhesive used may be any one of those shown above.

The anisotropic conductive interconnection material that uses the conductive particle 1 carrying thereon the insulating film according to the embodiment of the present invention may be sandwiched between two components for connection, placed facing each other, such as between a semiconductor device and a substrate or between a flexible wiring substrate and a liquid crystal display device. The resulting assembly may then be pressured under heating to yield an interconnection structure exhibiting an optimum conductive characteristic, an optimum insulating characteristic and an optimum interconnection strength in combination.

That is, the conductive particle 1 carrying thereon the insulating film according to the embodiment of the present invention includes the continuous insulating resin film 3 that is formed by welding of the fine particles 3a of the insulating resin and that covers the conductive particle 2 as the conductive base particle. There are formed larger numbers of voids A between the neighboring fine particles to assure the insulation properties between the bumps. In addition, the insulating resin film 3 of the outer shell is made susceptible to break to provide for facilitated reliable interconnection performance as well as high connection reliability in interconnection even with narrow-pitch bumps.

The conductive particle carrying thereon an insulating film, according to the embodiment of the present invention, may be prepared by a method including two steps. In a first step, an insulating resin film including larger numbers of voids in an initial state is formed by colliding the fine particles 3a of the insulating resin to a surface of a conductive particle that exhibits electrical conductivity at least in its surface. In a second step, the collision of the fine particles is continued to such an extent that the voids on the surface of the insulating resin film are decreased and the voids towards the base particle are maintained. This forms the conductive particle 1 carrying thereon an insulating film, the inner part of which presents larger numbers of preset voids, as described above. That is, the conductive particle 1 carrying thereon an insulating film, and which is used in the anisotropic conductive interconnection material that demonstrates a superior electrical conduction characteristic and an optimum insulating characteristic in establishing anisotropic conductive interconnection between circuit components, may be produced. It is thus possible to provide for facilitated interconnection as well as high interconnection reliability even with narrow-pitch bumps.

The method for producing a conductive particle according to the embodiment of the present invention includes causing larger numbers of fine particles of the insulating resin to collide with the surface of the base particle 2 to cause adhesion of the fine particles to the surface of the base particle to coat the surface with the insulating resin film. The insulating resin of the fine particle is selected from the group consisting of a cross-linked acrylic resin, a styrene-acryl copolymer, a divinylbenzene-acryl copolymer, a styrene-divinylbenzene copolymer, a melamine-formaldehyde copolymer, a silicone-acryl copolymer, a polyamide, a polyimide, polybutadiene and NBR. At least the surface of the base particle shows electrical conductivity. It is thus possible to produce the conductive particle 1 carrying thereon an insulating film, and which is used in the anisotropic conductive interconnection material that demonstrates a superior electrical conduction characteristic and an optimum insulating characteristic. This allows for establishing anisotropic conductive interconnection between circuit components. Moreover, it is possible to provide for facilitated interconnection as well as high reliability in the interconnection even with narrow-pitch bumps.

EXAMPLES

Certain Examples of the embodiment of the present invention are now described in detail. In the following description, Examples B1 to B4 represent the Examples of the embodiment of the present invention. These Examples are in a state B that may be arrived at by the second step of the method of the embodiment of the present invention after a previous state C that represents the first step. The previous state C is reached by the first step of the method of the embodiment of the present invention and is such a state in which the film in its entirety is sparse (see FIG. 3C). The state B is such a state in which a uniform smooth surface is formed and the bulk of the film is sparse (see FIG. 3B).

As Comparative Examples for comparison to the Examples of the embodiment of the present invention, Comparative Examples A1 to A3, which are in a state A having a film further formed commencing from the state B until the film is globally uniform in film thickness, are prepared (see FIG. 3A). Comparative Examples C1 to C3 in the state C, in which the film is sparse, as described above, are also prepared (see FIG. 3C). Evaluation was conducted under the following conditions.

In the Examples B1 to B4, Comparative Examples A1 to A3 and C1 to C3, conductive particles, provided with insulating film shapes B, A and C, respectively, were prepared with variable insulating film thicknesses, with the particle sizes of the conductive particles, as the base particles, each being 5 μm. Each of the three sorts of the particles was uniformly dispersed in an anionic curing epoxy adhesive material in a ratio of 40 wt % of the particles to 100 wt % of the anionic curing epoxy adhesive material to form a film 25 μm in thickness for use as a sample for evaluation. The fine particles of the insulating resin used were those of acrylic resin with variable particle sizes of 0.05, 0.2, 0.5 and 0.7 μm. The conditions for hybridization for producing the insulating film shapes A, B and C were 20 minutes with 16000 rpm for providing the state A, 10 minutes with 16000 rpm for providing the state B and three minutes for 16000 rpm for providing the state C.

As a specific evaluation method, an evaluation TEG for OCG was used, and the electrical resistance as well as a gap when a short circuit generates of each of the above samples was measured under the conditions as shown below. The gap when the short circuit generates was measured for evaluating the insulating properties.

Figure 4:
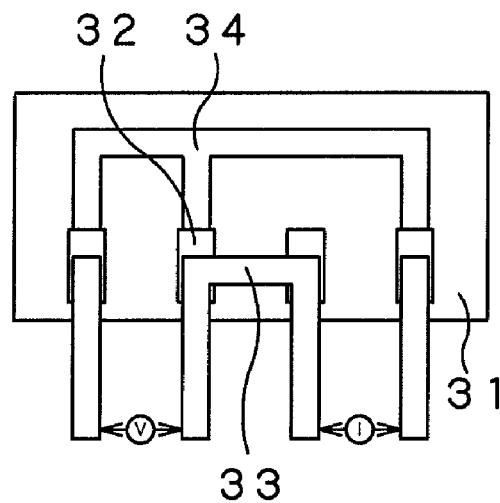
FIG. 4 is a schematic view schematically showing an IC chip for evaluation used for evaluating the conductive particles according to the Examples and those according to Comparative Examples.

To measure electrical conductivity, an IC for evaluation, shown in FIG. 4, was used under the conditions as shown below. In FIG. 4, 31 denotes an IC chip, 32 denotes a bump, and 33 denotes an ITO (indium tin oxide) pattern (ITO pattern). 34 denotes a metal pattern in the IC chip (metal pattern in a chip). V and I denote a site for voltage measurement and a site for current application, respectively.

Figure 5:
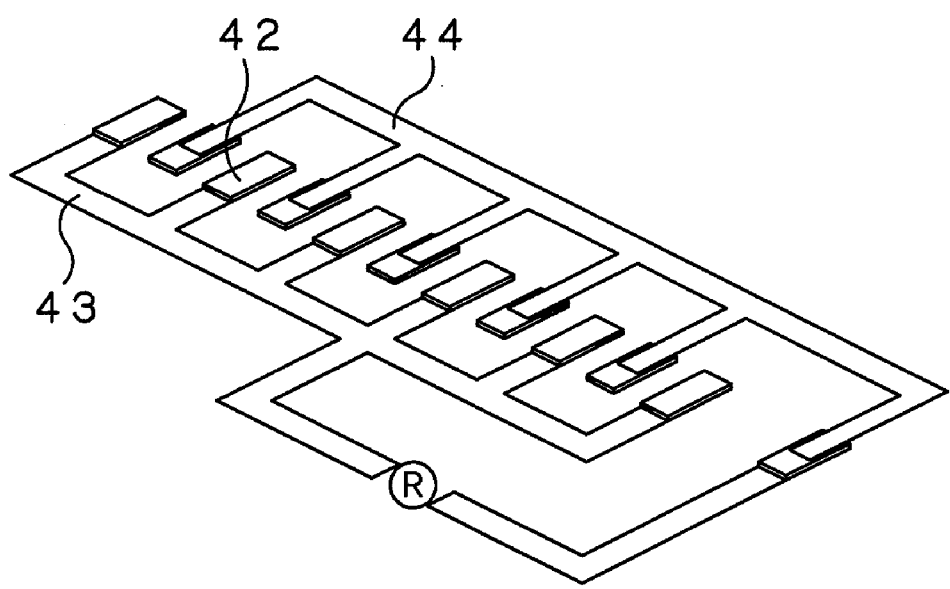
FIG. 5 is a schematic view schematically showing a glass substrate and an IC chip used for evaluating the conductive particles according to Examples and Comparative Examples.

[IC Chip for Evaluation]
Bump Size: 30×85 μm; Pitch: 50 μm; Height h of the gold-plated bump (Au-plated bump): 15 μm
Glass plate for evaluation (Grass): pattern ITO, 10 Ω/cm², t=0.7 mm
Bonding condition: 190° C., 40 MPa and 5 sec
Insulation measurement was carried out as shown in FIG. 5 under the conditions as shown below. In FIG. 5, 42 denotes a bump, 43 denotes an ITO pattern on a glass substrate and 44 denotes a metal pattern in an IC chip. R denotes a site for carrying out resistance measurement.
Bump Space: 15, 12.5, 10 and 7.5 μm; Bump Height: 15 μm
Bonding Condition: 190° C., 40 MPa and 5 sec
N=16 sets (10 points)/set The electrical conductivity and the insulating property were measured on evaluation samples of the Examples B1 to B4 and Comparative Examples A1 to A3 and C1 to C3, as described above. The results of evaluation are shown in Table 1, along with shapes of the insulating films and particle sizes of the fine particles of the insulating resins used.

TABLE 1

| Ex. Nos. | Insulating film shape | Insulating film thickness | Electrical resistance | Conductor spacing when a short circuit generates | Particle size of insulating fine particles |
|---|---|---|---|---|---|
| Comparative Example A1 | A | 0.05 μm | 0.1 Ω | 12.5 μm | 0.05 μm |
| Comparative Example A2 | A | 0.2 μm | 0.5 Ω | 10 μm | 0.2 μm |
| Comparative Example A3 | A | 0.5 μm | 2.0 Ω | 10 μm | 0.5 μm |
| Example B1 | B | 0.05 μm | 0.05 Ω | 12.5 μm | 0.05 μm |
| Example B2 | B | 0.2 μm | 0.05 Ω | 10 μm | 0.2 μm |
| Example B3 | B | 0.5 μm | 0.1 Ω | 10 μm | 0.5 μm |
| Example B4 | B | 0.7 μm | 0.3 Ω | 7.5 μm | 0.7 μm |
| Comparative Example C1 | C | 0.05 μm | 0.05 Ω | 20 μm | 0.05 μm |
| Comparative Example C2 | C | 0.2 μm | 0.05 Ω | 15 μm | 0.2 μm |
| Comparative Example C3 | C | 0.5 μm | 0.05 Ω | 15 μm | 0.5 μm |

With the Comparative Examples A1 to A3 of Table 1, the conductive particle A, having a uniform insulating resin film, free of voids, is protected tightly by the insulating resin film, and hence exhibits satisfactory conductor spacing when the short circuit generates. However, the particle A has a high value of the electrical resistance, which is not satisfactory with narrow-pitch bumps.

The conductive particles C, having larger numbers of voids but obtained with use of shorter hybridization time, according to the Comparative Examples C1 to C3 of Table 1, are susceptible to peel-off. Although the values of the electrical resistance of the particles are satisfactory, the conductor spacing when the short circuit generates are longer. Hence, these particles are not desirable for use in narrow-pitch bumps.

With the Examples B1 to B4 of the embodiment of the present invention, in distinction from the above Comparative Examples, the insulating resin film exhibits larger numbers of preset voids on its inner peripheral surface that coats a conductive resin film, while presenting a continuous uniform outer peripheral film surface. In other words, this insulating resin film is provided with an inner insulating resin layer having larger numbers of preset voids and with an outer shell-like insulating resin layer. This may be achieved by controlling the conditions of hybridization, such as rpm or time, as later described in detail.

With the Examples B1 to B4, the insulating resin films are provided with larger numbers of the inner voids and hence may be protected from being peeled off. The electrical resistance and the conductor spacing when the short circuit generates are of values that may cope with narrow-pitch bumps. With the anisotropic conductive film, containing the conductive particles, it is possible to provide for facilitated interconnection of narrow-pitch bumps of the particle size of, for example, 30×85 μm and the pitch on the order of 50 μm.

It is seen from the above-described Examples that the conductive particle provided with the insulating film of the present Example may be so formed that larger numbers of voids will be present in a proper state in the insulating resin film that coats the conductive particle. That is, the conductive particle has as its outer shell an insulating resin film that may cope with the narrow pitch bumps. This is made possible by judiciously controlling the conditions of hybridization using the aforementioned fine particles operating as an insulating film.

With the conductive particle, provided with the insulating film, according to the embodiment of the present invention, it is possible to assure bump-to-bump insulating properties in contradistinction from the conductive particle that is uniform along the thickness of an insulating resin film in related art. Moreover, the outer shell of the resin film may readily be cracked on pressuring due to the presence of the voids. The base particles on the bump may thus be readily collapsed to assure improved connection reliability even with narrow-pitch bumps.

Thus, according to the embodiment of the present invention, the connection reliability may be improved even with narrow-pitch bumps in the anisotropic conductive circuit interconnection.

Although the present invention has so far been described with reference to preferred embodiments, the present invention is not to be restricted to the embodiments. It is to be appreciated that those skilled in the art can change or modify the embodiments without departing from the spirit and the scope of the present invention.

The invention claimed is:
1. A conductive particle comprising:
a base particle exhibiting electrical conductivity at least on a surface thereof and a continuous insulating resin film that covers said base particle;
wherein said insulating resin film comprises:
an inner insulating resin layer, which is formed by fine particles adhering on the surface of said base particle with voids towards said base particle; and
an outer shell insulating layer formed continuously and uniformly at an outer surface of the insulting resin layer by welding of said fine particles.
2. The conductive particle according to claim 1 wherein a void ratio representing a volume ratio of said voids to a total volume of said insulating resin film inclusive of said voids is in the range of 19.1 to 38.1 percentage points.
3. The conductive particle according to claim 1 wherein said fine particles are formed of a material selected from the group consisting of a cross-linked acrylic resin, a styrene-acryl copolymer, a divinylbenzene-acryl copolymer, a styrene-divinylbenzene copolymer, a melamine-formaldehyde copolymer, a silicone-acryl copolymer, a polyamide, a polyimide, polybutadiene and nitrile butadiene rubber.
4. An anisotropic conductive interconnection material comprising a plurality of said conductive particles according to claim 1; said conductive particles being dispersed in an insulating adhesive.

5. An anisotropic conductive interconnection material comprising a plurality of said conductive particles according to claim 2, said conductive particles being dispersed in an insulating adhesive.

6. An anisotropic conductive interconnection material comprising a plurality of said conductive particles according to claim 3, said conductive particles being dispersed in an insulating adhesive.

7. The conductive particle according to claim 1, wherein the voids are formed at the inner surface of said insulating resin film adjacent the base particle.

* * * * *